United States Patent
Pang

(10) Patent No.: US 6,204,116 B1
(45) Date of Patent: Mar. 20, 2001

(54) METHOD OF FABRICATING A CAPACITOR WITH A LOW-RESISTANCE ELECTRODE STRUCTURE IN INTEGRATED CIRCUIT

(75) Inventor: Shu-Koon Pang, Hsinchu Hsien (TW)

(73) Assignee: Worldwide Semiconductor Manufacturing Corp., Hsinchu (TW)

( * ) Notice: Subject to any disclaimer, the term of this patent is extended or adjusted under 35 U.S.C. 154(b) by 0 days.

(21) Appl. No.: 09/326,391

(22) Filed: Jun. 4, 1999

(30) Foreign Application Priority Data

May 14, 1999 (TW) .................................................. 88107842

(51) Int. Cl.[7] .............................................. H01L 21/8242
(52) U.S. Cl. .......................... 438/253; 438/250; 438/393; 438/396; 438/655; 438/682; 438/683; 438/239; 438/970
(58) Field of Search ...................... 438/970, 250, 438/253, 393, 396, 655, 682, 683, 239

(56) References Cited

U.S. PATENT DOCUMENTS

| | | | |
|---|---|---|---|
| 4,411,734 | * 10/1983 | Maa | 156/643 |
| 5,356,826 | * 10/1994 | Natsume | 438/238 |
| 5,597,759 | * 1/1997 | Yoshimori | 437/60 |
| 5,882,946 | * 3/1999 | Otani | 437/60 |
| 6,114,199 | * 9/2000 | Isobe et al. | 438/240 |

OTHER PUBLICATIONS

Wolf et al., "Silicon Processing for the VLSI Era vol. 2–Process Integration," pp. 201–204, 1990.*

* cited by examiner

*Primary Examiner*—John F. Niebling
*Assistant Examiner*—Jennifer M. Kennedy
(74) *Attorney, Agent, or Firm*—J.C. Patents; Jiawei Huang

(57) ABSTRACT

A semiconductor fabrication method is provided for fabricating a capacitor with a low-resistance electrode structure in a mixed-mode integrated circuit (IC) device. The first step is to prepare a semiconductor substrate having a first area where a gate and a pair of source/drain regions are defined and a second area where a first electrode is defined. A first dielectric layer is then formed to cover the first electrode. After this, a doped polysilicon layer, a metal silicide layer, and a second dielectric layer are successively formed over the first dielectric layer, which in combination constitute a second electrode for the capacitor. The incorporation of the metal silicide layer in the second electrode can significantly help reduce the overall resistance of the second electrode, thereby allowing a considerable increase to the overall performance of the resulting IC device. Moreover, the method is less complex in process and thus easier to perform than the prior art.

16 Claims, 2 Drawing Sheets

METHOD OF FABRICATING A CAPACITOR WITH A LOW-RESISTANCE ELECTRODE STRUCTURE IN INTEGRATED CIRCUIT

CROSS-REFERENCE TO RELATED APPLICATION

This application claims the priority benefit of Taiwan application serial no. 88107842, filed May 14, 1999, the full disclosure of which is incorporated herein by reference.

BACKGROUND OF THE INVENTION

1. Field of the Invention

This invention relates to integrated circuit (IC) fabrication technology, and more particularly, to a method of fabricating a capacitor with a low-resistance electrode structure in a mixed-mode IC device.

2. Description of Related Art

Since IC fabrication technology has advanced to the deep-submicron level, a single IC device can now provide a high packing density and functionality. However, the deep-submicron downsizing of the various semiconductor components in the IC device can also affect the performance of the IC device.

A mixed-mode IC device is a type of IC device that includes both analog and digital circuitry on the same device. It typically includes a capacitor element which can function as a switched capacitor filter for the analog circuitry and function as a storage node in the digital circuitry for data storage. The electrodes of the capacitor element are typically formed from doped polysilicon. One drawback to using doped polysilicon to form the capacitor electrodes, however, is that doped polysilicon has a high resistance that still causes the charge/discharge process to be unsatisfactorily slow. The resulting IC device thus has a low performance. Moreover, at the deep submicron level of integration, the electrode resistance is even further increased due to the downsizing of the electrodes, furtherdegrading the IC's performance.

SUMMARY OF THE INVENTION

It is therefore an objective of this invention to provide a new semiconductor fabrication method for fabricating a capacitor, which method can help reduce the resistance of the electrode structure of the capacitor.

In accordance with the foregoing and other objectives of this invention, a new IC fabrication method is provided for fabricating a capacitor with a low-resistance electrode in a mixed-mode IC device. The method of the invention is designed for fabricating a capacitor in a mixed-mode integrated circuit constructed on a semiconductor substrate having a first area where a gate and a pair of source/drain regions are defined and a second area where a first electrode is defined. The method of the invention comprises the steps of: (1) forming a first dielectric layer covering the first electrode; (2) forming a doped polysilicon layer over the first dielectric layer, (3) forming a metal silicide layer over the doped polysilicon layer; (4) forming a second dielectric layer over the metal silicide layer; and (5) performing a selective removal process on the second dielectric layer, the metal silicide layer, and the doped polysilicon layer, with the remaining parts thereof in combination constituting a second electrode, and the second electrode, the first dielectric layer, and the first electrode in combination constituting the intended capacitor.

The method of the invention is characterized by the incorporation of a metal silicide layer in the second electrode, which can significantly help reduce the overall resistance of the second electrode, thereby allowing the resulting capacitor to charge/discharge more rapidly, thus allowing an increase in the overall performance of the resulting mixed-mode IC device. Moreover, by the method of the invention, since the second dielectric layer and the first dielectric layer are identical in material and thickness, it is easy to distinguish them as etching end points, allowing the etching process to be less complex and thus easier to perform than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a method of fabricating a capacitor with a low-resistance electrode structure in a mixed-mode IC device, with the detailed steps thereof disclosed in the following with reference to FIGS. 1A–1D.

Figure 1A:
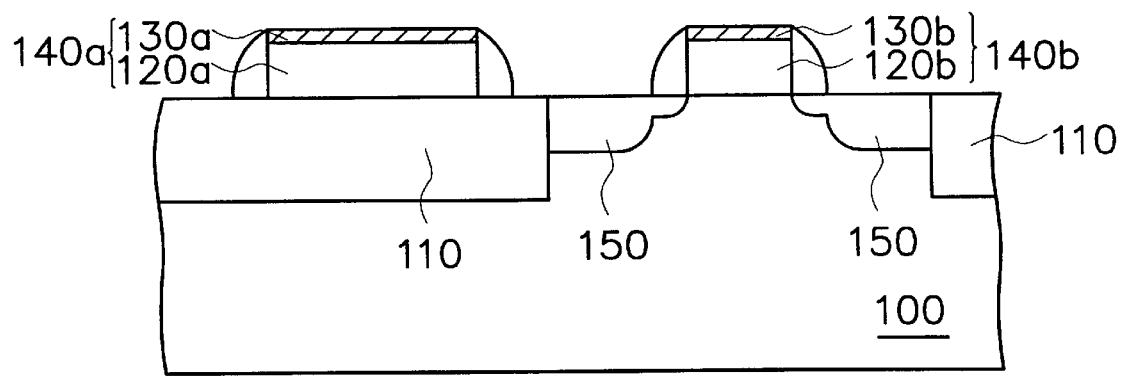
FIGS. 1A–1D are schematic block diagrams used to depict the steps involved in the method of the invention for fabricating a capacitor with a low-resistance electrode in a mixed-mode IC device.

Referring first to FIG. 1A, in the first step of the fabrication process, a semiconductor substrate 100 is prepared. Next, the substrate 100 is formed with isolation structures 110, such as shallow-trench isolation (STI) structures, at predefined locations. After this, a first electrode 140a and a gate 140b are formed at predefined locations over the substrate 100. The first electrode 140a is composed of a doped polysilicon layer 120a and a metal silicide layer 130a; and similarly, the gate 140b is composed of a doped polysilicon layer 120b and a metal silicide layer 130b. A pair of source/drain regions 150 is formed on both sides of the gate 140b.

Figure 1B:
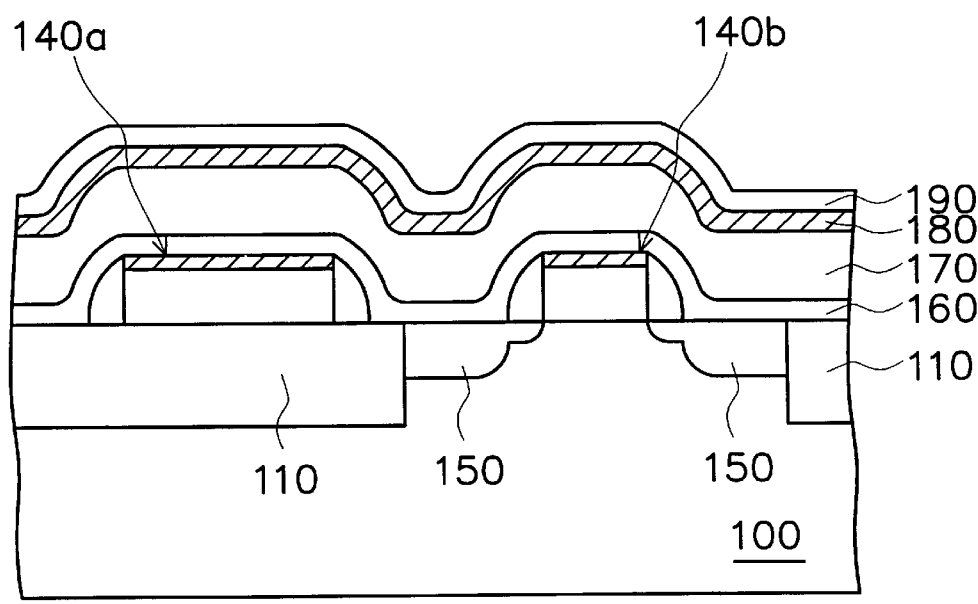

Referring next to FIG. 1B, in the subsequent step, a first dielectric layer 160 is formed over the entire top surface of the wafer, preferably from silicon nitride, through a PECVD (Plasma-Enhanced Chemical-Vapor Deposition) process to a thickness of about 350 Å (angstrom). Next, an annealing process is performed for the purpose of strengthening the bonding between the first dielectric layer 160 and the underlying components. This annealing process is performed, for example, at a temperature of about 700° C. for 20 minutes.

Subsequently, a doped polysilicon layer 170 is formed over the first dielectric layer 160. This doped polysilicon layer 170 can be formed, for example, through a first step of depositing polysilicon over the wafer through a CVD (Chemical-Vapor Deposition) process, a second step of doping impurity ions, such as arsenic (As) ions with a concentration of $1 \times 10^{16}$ atom/cm$^2$, into the doped polysilicon, and a final step of performing an annealing process at a temperature of 700° C. for about 20 minutes to help diffuse the doped impurity ions.

In the subsequent step, a metal silicide layer 180 is formed over the doped polysilicon layer 170, preferably from titanium silicide through a self-aligned silicide (also called salicide) process. The self-aligned silicide process includes a first step of depositing titanium to a thickness of about 300 Å, a second step of performing a rapid annealing process at a temperature of about 700° C. for 20 seconds, whereby the deposited titanium can react with the silicon atoms in the underlying doped polysilicon layer 170 to form titanium silicide, and a final step of removing the unreacted part of the titanium.

Next, a second dielectric layer 190 is formed over the metal silicide layer 180. The second dielectric layer 190, similar to the first dielectric layer 160, is preferably formed from silicon nitride through a PECVD process to a thickness of about 350 Å.

Figure 1C:
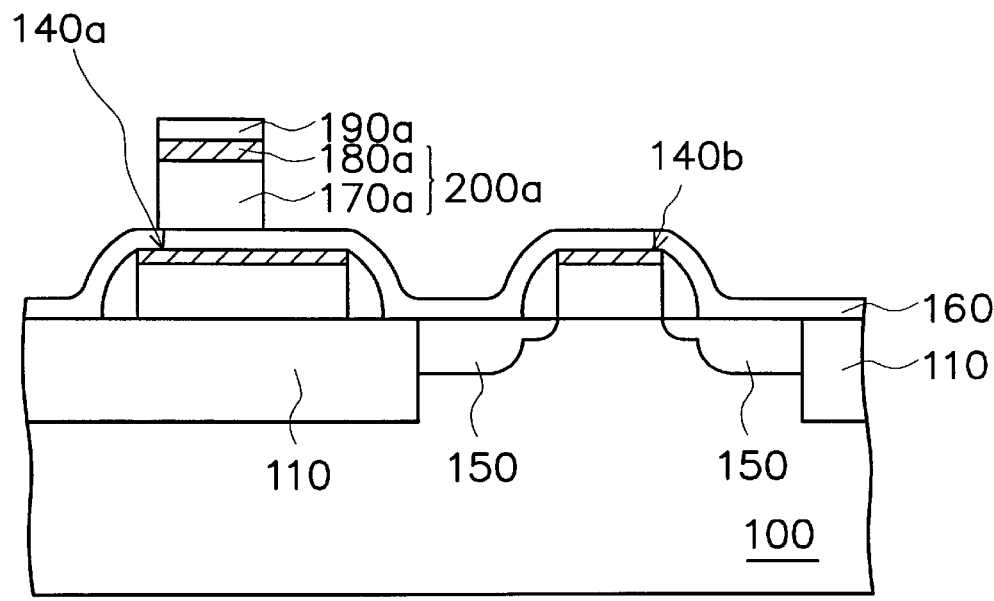

Referring further to FIG. 1C, in the subsequent step, a selective removal process is performed to remove selected parts of the second dielectric layer 190, the metal silicide layer 180, and the doped polysilicon layer 170, with the remaining parts thereof being left above the first electrode 140*a* but isolated by the first dielectric layer 160 (the remaining parts of the second dielectric layer 190, the metal silicide layer 180, and the doped polysilicon layer 170 are herein respectively designated by the reference numerals 1 90*a*, 180*a*, and 170*a* for distinguishing purpose). The remaining doped polysilicon layer 170*a* and the metal silicide layer 180*a* in combination constitute a second electrode, which is designated by the reference numeral 200*a*. It is a characteristic feature of the invention that the incorporation of the metal silicide layer 180*a* in this second electrode 200*a* can significantly reduce the overall resistance of the second electrode 200*a*.

Figure 1D:
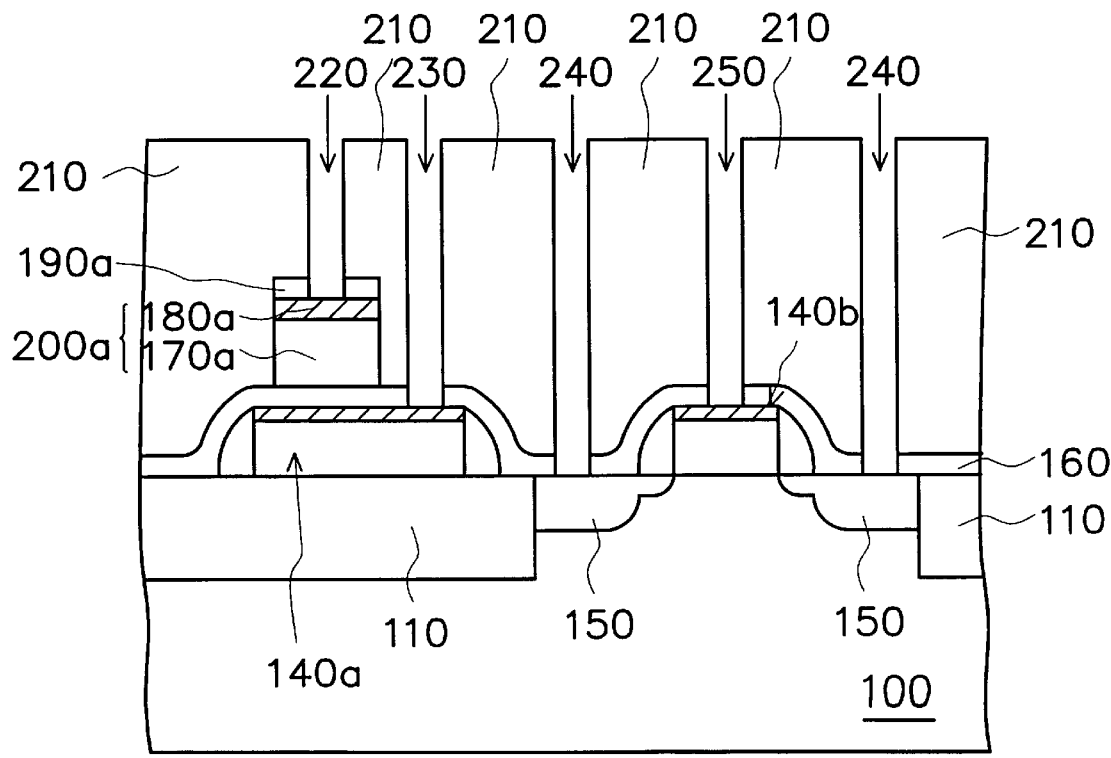

Referring next to FIG. 1D, in the subsequent step, a planarized insulating layer 210 is formed over the entire top surface of the wafer. This insulating layer 210 can be formed, for example, through a first step of depositing BPSG (borophosphosilicate glass) through an APCVD (Atmospheric-Pressure Chemical-Vapor Deposition) process over the wafer, a second step of performing a heat-treatment process under a temperature of 700° C. for 30 minutes in an nitrogen environment, a third step of depositing silicon oxide over the deposited BPSG through an LPCVD (Low-Pressure Chemical-Vapor Deposition) process, and a final step of performing a chemical-mechanical polishing (CMP) process for planarization of the deposited silicon oxide.

In the subsequent step, the insulating layer 210 is selectively etched away to form a first contact window 220 to expose the second electrode 200*a*; a second contact window 230 to expose the first electrode 140*a*; a pair of third contact windows 240 to expose the source/drain regions 150; and a fourth contact window 250 to expose the gate 140*b*. In this selective etching process, since the second dielectric layer 190*a* and the first dielectric layer 160 are identical in material and thickness, it is easy to distinguish them as etching end points. For example, a highly-selective etching process can be first performed for selective removal of the insulating layer 210, and during which the second dielectric layer 190*a* and the first dielectric layer 160 serve as the first etching end point, and next, a subsequent etching process is performed in time mode to etch the second dielectric layer 190*a* and the first dielectric layer 160.

In conclusion, the method of the invention has the following advantages over the prior art.

First, the incorporation of the metal silicide layer 180*a* in the second electrode 200*a* can significantly help reduce the overall resistance of the second electrode 200*a*, thereby allowing the resulting capacitor to charge/discharge more rapidly, thus allowing an increase in the overall performance of the resulting mixed-mode IC device.

Second, in the selective etching process for forming the contact windows, since the second dielectric layer 190*a* and the first dielectric layer 160 are identical in material and thickness, it is easy to distinguish them as etching end points, allowing the etching process to be less complex and thus easier to perform than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a capacitor in a mixed-mode integrated circuit constructed on a semiconductor substrate having a first area where a gate and a pair of source/drain regions are defined and a second area where a first electrode is defined; the method comprising the steps of:

forming a first dielectric layer covering the first electrode;

forming a doped polysilicon layer over the first dielectric layer, forming a metal silicide layer over the doped polysilicon layer;

forming a second dielectric layer over the metal silicide layer, wherein the first dielectric layer and the second dielectric layer are both formed from a same dielectric material and have a same thickness, performing a selective removal process on the second dielectric layer, the metal silicide layer, and the doped polysilicon layer, with the remaining parts therefor in combination constituting a second electrode, and the second electrode, the first dielectric layer and the first electrode in combination constituting the intended capacitor.

2. The method of claim 1, further comprising the steps of:

forming a planarized insulating layer over the first dielectric layer and the second electrode; and forming a first contact window to expose the second electrode and a second contact window to expose the first electrode.

3. The method of claim 1, wherein the first dielectric layer is formed from silicon nitride.

4. The method of claim 1, wherein the second dielectric layer is formed from silicon nitride.

5. The method of claim 1, wherein the metal silicide layer is formed from titanium silicide through a self-aligned silicide process.

6. A method for fabricating a capacitor in an integrated circuit, comprising the steps of:

preparing a semiconductor substrate;

forming a first electrode over the substrate;

forming a first dielectric layer covering the first electrode; and forming a second electrode over the first dielectric layer above the first electrode; and the second electrode being composed of a doped polysilicon layer over the first dielectric layer, a metal silicide layer over the doped polysilicon layer, and a second dielectric layer over the metal silicide layer, wherein the second dielectric layer is formed with same material and has a same thickness as the first dielectric layer.

7. The method of claim 6, further comprising the steps of:

forming a planarized insulating layer over the first dielectric layer and the second electrode; and forming a first contact window to expose the second electrode and a second contact window to expose the first electrode.

8. The method of claim 6, wherein the first dielectric layer is formed from silicon nitride.

9. The method of claim 6, wherein the second dielectric layer is formed from silicon nitride.

10. The method of claim 6, wherein the metal silicide layer is formed from titanium silicide through a self-aligned silicide process.

11. The method of claim 6, wherein the first electrode includes:

a doped polysilicon layer; and a metal silicide layer over the doped polysilicon layer.

12. The method of claim 11, wherein the metal silicide layer is formed from titanium silicide through a self-aligned silicide process.

13. A method for fabricating a capacitor in an integrated circuit, comprising:

forming a first electrode over a substrate;

forming a first dielectric layer over the substrate covering the first electrode, wherein the first dielectric layer also serves as an etching end point;

forming a second electrode over the first dielectric layer above the first electrode, wherein the second electrode comprises a doped polysilicon layer and a metal silicide layer, and the second electrode is covered by a second dielectric layer which also serves as an etching end point;

forming a planarized insulating layer over the first dielectric layer and the second dielectric layer;

etching at selective sites of the insulating layer until a part of the insulating layer and the underlying first dielectric layer and the second dielectric layer are removed to form contact windows.

14. The method according to claim 13, wherein the first dielectric layer and the second dielectric layer are both formed with the same material and has the same thickness.

15. The method according to claim 13, wherein the first electrode is formed by:

forming a doped polysilicon layer on the substrate; and forming a metal silicide layer on the doped polysilicon layer.

16. The method according to claim 13, wherein the contact windows expose the first electrode and the second electrode.

* * * * *